(12) United States Patent
Lee

(10) Patent No.: US 7,911,287 B2
(45) Date of Patent: Mar. 22, 2011

(54) MULTI-PHASE LAYOUT STRUCTURE AND METHOD

(75) Inventor: Chao-Cheng Lee, HsnChu (TW)

(73) Assignee: Realtek Semiconducutor Corp., Hsinchu (TW)

( * ) Notice: Subject to any disclaimer, the term of this patent is extended or adjusted under 35 U.S.C. 154(b) by 191 days.

(21) Appl. No.: 12/132,829

(22) Filed: Jun. 4, 2008

(65) Prior Publication Data

US 2008/0297271 A1   Dec. 4, 2008

(30) Foreign Application Priority Data

Jun. 4, 2007   (TW) ................................ 96119948 A

(51) Int. Cl.
*H01P 3/02*   (2006.01)
(52) U.S. Cl. ................................ 333/1; 333/5
(58) Field of Classification Search .................. 333/1, 4, 333/5, 238
See application file for complete search history.

(56) References Cited

U.S. PATENT DOCUMENTS

| | | | |
|---|---|---|---|
| 5,966,056 A * | 10/1999 | Thornton | 333/5 |
| 6,420,778 B1 * | 7/2002 | Sinyansky | 257/664 |
| 6,914,502 B2 * | 7/2005 | Otsuka et al. | 333/238 |
| 7,196,597 B2 * | 3/2007 | Saitou et al. | 333/204 |
| 2005/0099240 A1 * | 5/2005 | Lin et al. | 333/5 |
| 2006/0108964 A1 | 5/2006 | Shibatani | |

* cited by examiner

*Primary Examiner* — Benny Lee
(74) *Attorney, Agent, or Firm* — Thomas, Kayden, Horstemeyer & Risley, LLP

(57) ABSTRACT

The present invention provides a multi-phase layout structure and method. The layout structure comprises: a first layout layer; a second layout layer substantially parallel to the first layout layer; a plurality of traces, each transmitting a signal, and the plurality of signals having a phase difference between each other; wherein a horizontal coupling capacitance is provided between two neighboring traces configured on the same layer of the first layout layer and the second layout layer, a vertical coupling capacitance is provided between two neighboring traces configured on different layers of the first layout layer and the second layout layer, and the plurality of traces have substantially the same total coupling capacitance wherein the total coupling capacitance is defined by the horizontal coupling capacitance and the vertical coupling capacitance.

20 Claims, 10 Drawing Sheets

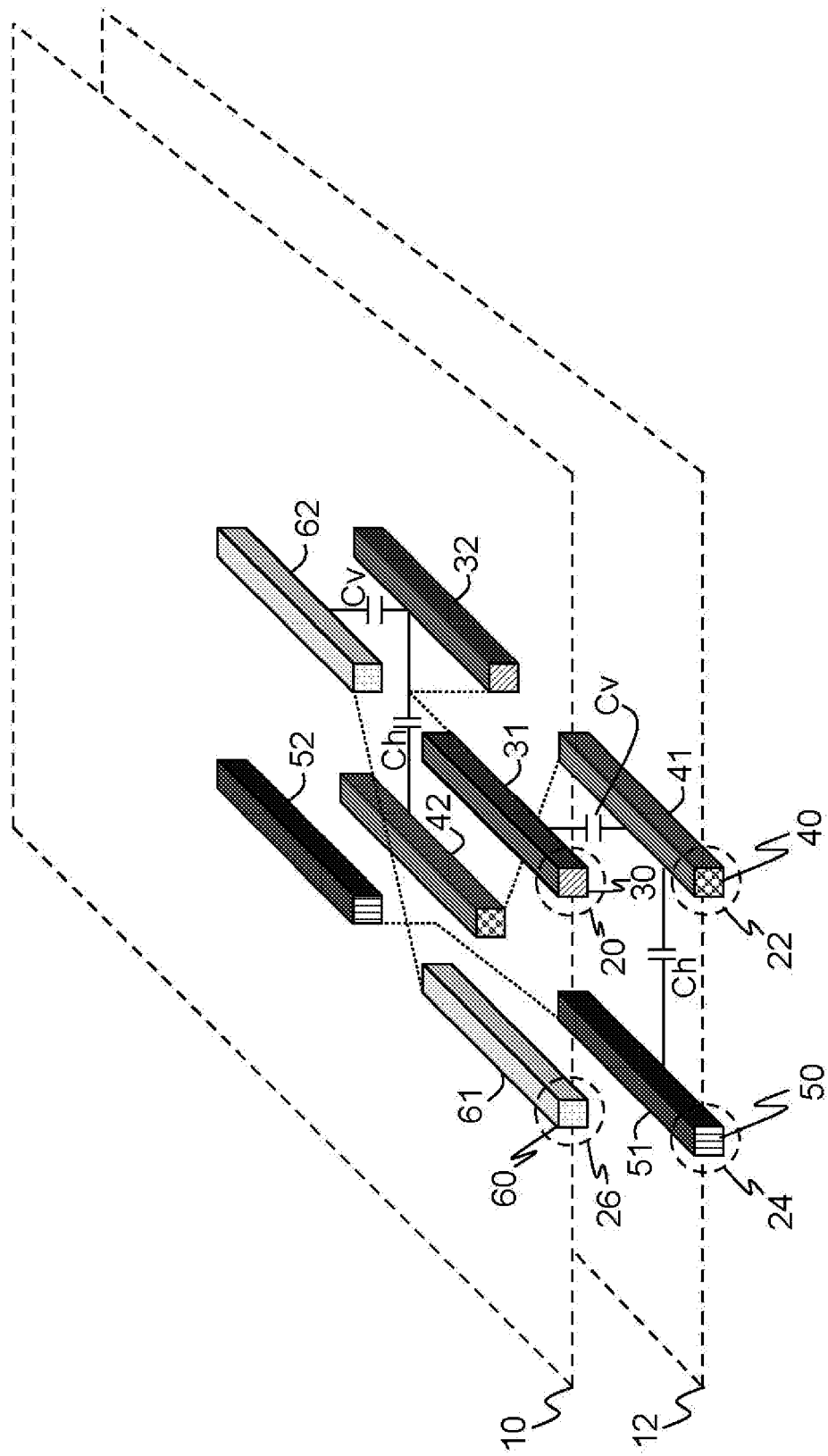

MULTI-PHASE LAYOUT STRUCTURE AND METHOD

CROSS-REFERENCES TO RELATED APPLICATIONS

This non-provisional application claims priority under 35 U.S.C. §119(a) on Patent Application No(s). 96119948 filed in Taiwan, R.O.C. on Jun. 4, 2007, the entire contents of which are hereby incorporated by reference.

TECHNICAL FIELD

The present invention relates to a layout structure and method, and particularly to a multi-phase layout structure and method.

BACKGROUND OF THE INVENTION

In the conventional technology, multi-phase signal layout causes delays because of the length of the signal line. Although wafer processing has not entered the sub-micron level, great attention should be paid to layout arrangement in order to avoid serious resistance/capacitance effect, and particularly to avoid excessively long traces which may cause excessive system delay.

In the conventional trace arrangement, the layout proceeds without violating the design rules conventionally implemented at a fabrication facility. However, in the actual circuit layout, the traces exhibit coupling capacitance in between, resulting in undesired effects more serious than expected. Serious interference may occur if the traces of the analog circuit are arranged near the digital circuit. This is especially the case for an analog circuit, which is generally sensitive to trace arrangement or layout.

In addition to the effect caused by coupling capacitance, multi-phase delay time also causes other problems. FIG. 1A is a schematic view showing a layout of multi-phase signal traces in the prior art ($\Phi_0$, $\Phi_1$, $\Phi_2$, and $\Phi_3$ denote signals of first, second, third, and fourth phases). Although the signal traces are of equal length, the loading viewed from one signal trace (such as coupling capacitance), may not be identical to that from another signal trace, so that the delay time from the input to the output (td0, td1, td2, and td3), for the signal on each signal trace may vary (td0≠td1≠ . . . ). The varied delay time between phases may influence, for example, the characteristics and performance of a circuit. Therefore, another layout method for multi-phase signal trace has been proposed in the prior art, as shown in FIG. 1B; wherein a grounding trace or a grounding potential GND is provided between each two signal traces in the tracing arrangement. The signal of each phase ($\Phi_0$, $\Phi_1$, $\Phi_2$, and $\Phi_3$) thus has an equal delay time (td0, td1, td2, and td3) from input to output. However, the layout method in FIG. 1B has other defects. For example, a larger layout area is needed.

The difficulty of how to solve the effect caused by coupling capacitance in the layout method thus becomes an urgent problem requiring solution.

SUMMARY OF THE INVENTION

To this end, the present invention discloses a layout structure for carrying multi-phase signals, which can effectively eliminate the effect caused by the delay time between multi-phase signals. By employing a geometrically symmetric mechanism or electrically symmetric mechanism, the present invention ensures the coupling capacitances between phases match each other.

The present invention provides a layout structure for carrying multi-phase signals, which comprises: a first layout layer; a second layout layer substantially parallel to the first layout layer; a plurality of traces, each carrying a signal, and the plurality of signals having a phase difference between each other; wherein a horizontal coupling capacitance is provided between two neighboring traces configured on the same layer of the first layout layer and the second layout layer, a vertical coupling capacitance is provided between two neighboring traces configured on different layers of the first layout layer and the second layout layer, and the plurality of traces have substantially the same total coupling capacitance wherein the total coupling capacitance is defined by the horizontal coupling capacitance and the vertical coupling capacitance.

The present invention also provides another layout method, which includes the following steps: providing a first layout layer and a second layout layer, where the first layout layer and the second layout layer are substantially parallel to each other; forming a plurality of signal traces, in which a horizontal coupling capacitance is provided between two neighboring traces configured on the same layer of the first layout layer and the second layout layer, a vertical coupling capacitance is provided between two neighboring traces configured on different layers of the first layout layer and the second layout layer, and the plurality of traces have substantially the same total coupling capacitance wherein the total coupling capacitance is defined by the horizontal coupling capacitance and the vertical coupling capacitance.

With reference to the drawings appended herewith, the preferred embodiments and the benefits of the present invention will be further described as follows.

BRIEF DESCRIPTION OF THE DRAWINGS

FIG. 2C is a schematic view of a first embodiment of the present invention (1);

DETAILED DESCRIPTION OF PREFERRED EMBODIMENTS

Figure 1A:
FIG. 1A is a diagram showing a first type of conventional multi-phase, high frequency circuit layout.
Figure 1B:
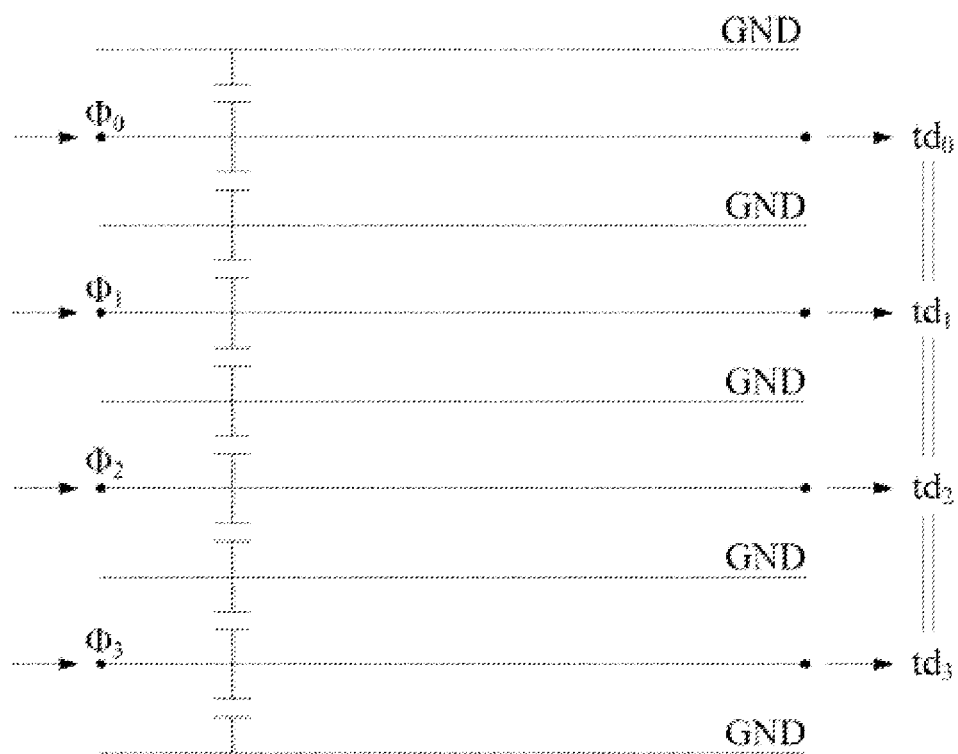
FIG. 1B is a diagram showing a second type of conventional multi-phase high frequency circuit layout.
Figure 2A:
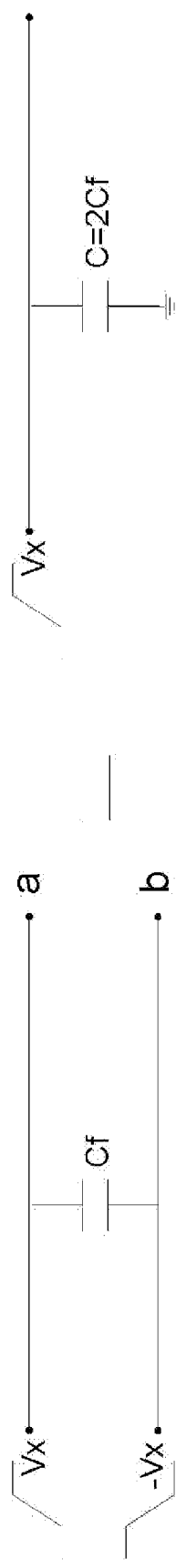
FIG. 2A is a principle exposition diagram (1)

In the following description, like reference numbers used in different figures are used to designate like or common components, and as such may not be separately described in connection with the description of each figure. Before the description of the present invention, please first refer to FIG. 2A, which is a principle exposition diagram (1). In FIG. 2A, trace a is used to carry a voltage signal Vx, and trace b is used to carry a voltage signal −Vx, that is, the signals carried by trace a and trace b will have a phase difference of 180 degree. As deduced using the formula below, the left-hand circuit in FIG. 2A is equivalent to the right-hand circuit.

$$C = \frac{q}{V}; \quad (1)$$

$$i = \frac{dq}{dt}; \quad (2)$$

$$i = Cf \times \frac{dV}{dt}; \quad (3)$$

wherein C denoted capacitance, q denotes charge, V denotes voltage, i denoted current, dq/dt denotes a change in charge (dq) during a corresponding change in time (dt), Cf denotes a coupling capacitance between trace a and trace b, and dV/dt denotes a change in voltage (dV) during a corresponding change in time (dt).

By substituting (2) into (3):

$$\frac{dq}{dt} = Cf \times \frac{dV}{dt}; \quad (4)$$

The voltage variance in unit time is Vx−(−Vx)=2Vx, so (4) becomes:

q=Cf×2V . . . (5), then substituting (5) into (1): C=2Cf.

Figure 2B:
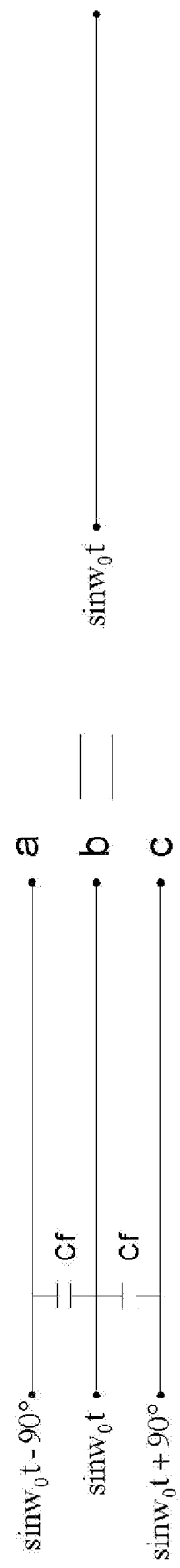
FIG. 2B is a principle exposition diagram (2)

Next, please refer to FIG. 2B, which is a principle exposition diagram (2). As shown in the figure, the trace a is carrying a sinusoidal signal with phase angle sin(w$_0$t−90°), and the trace b is carrying a sinusoidal signal with a phase angle sinw$_0$t, and trace c is carrying a sinusoidal signal with phase angle sin(w$_0$t+90°); wherein, the signals carried by trace a and trace c the phrase difference between the two traces is 180 degrees. From the result in FIG. 2A, it can be seen that when the coupling capacitance between trace a and trace b and the coupling capacitance between trace b and trace c are matched with each other, the left-hand circuit in FIG. 2B is equivalent to the right-hand circuit. Thus, when the capacitances between traces are matched with each other, the disadvantages caused by the capacitance can be construed as removed.

Please refer to FIG. 2C, which is a schematic view of a first embodiment of the present invention (1). The layout structure for multi-phase signal of the first embodiment comprises: a first layout layer 10, a second layout layer 12, a first trace 30, a second trace 40, a third trace 50 and a fourth trace 60. The first trace 30, the second trace 40, the third trace 50 and the fourth trace 60 are used to respectively carry four multi-phase signals. The phases of the four multi-phase signals are 0 degrees, 90 degrees, 180 degrees, and 270 degrees.

Figure 2D:
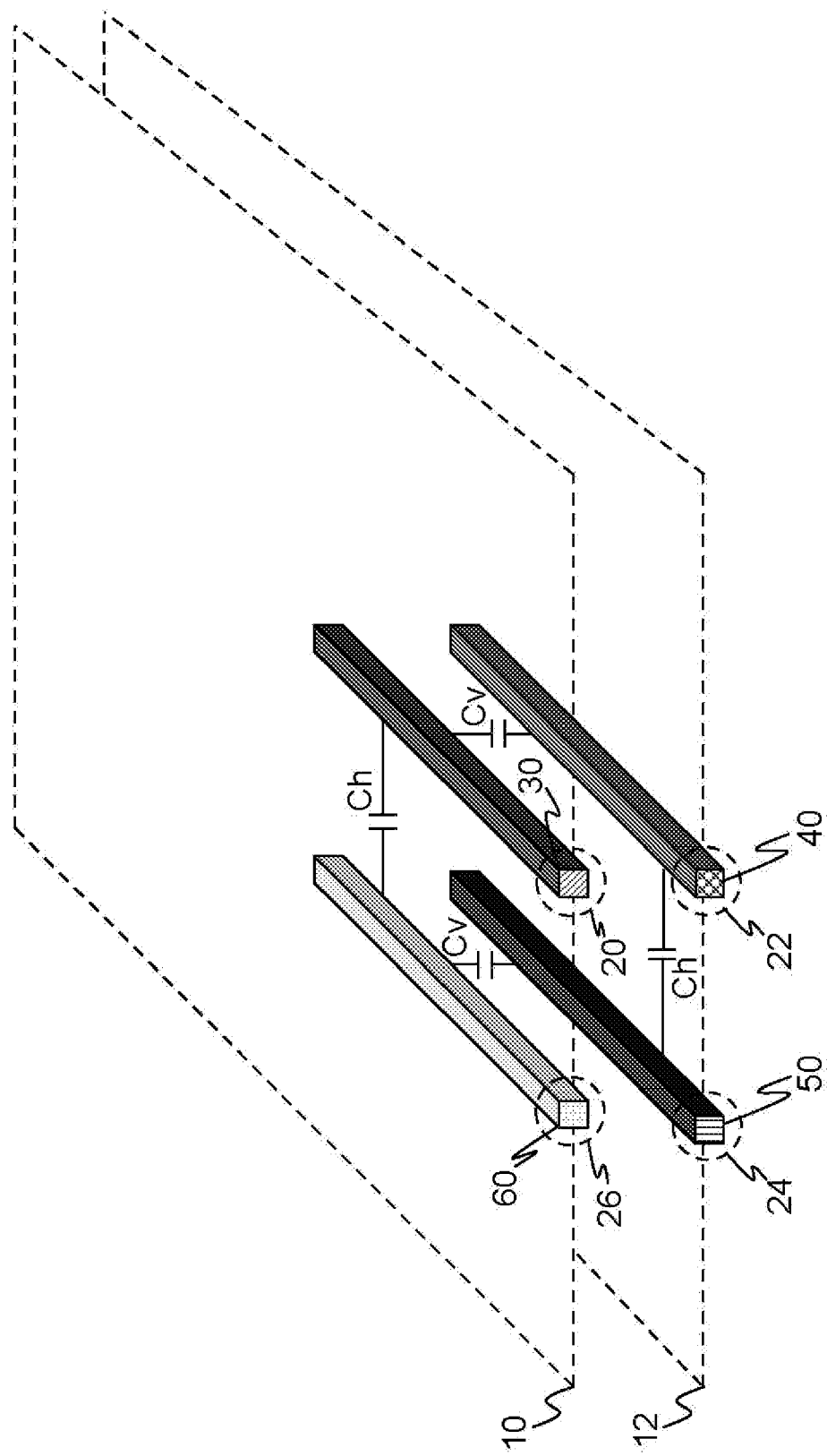
FIG. 2D is a schematic view of the first embodiment of the present invention (2)

As shown in FIG. 2D, the first layout layer 10 and the second layout layer 12 are in parallel, and the first layout layer 10 has a first location 20 and a fourth location 26, and the second layout layer 12 has a second location 22 and a third location 24.

There is a coupling capacitance between two neighboring traces. For example, a horizontal coupling capacitance Ch is provided between two neighboring traces configured on the same layer of the first layout layer 10 and the second layout layer 12. As shown in FIG. 2D, the first trace 30 and the fourth trace 60 have a horizontal coupling capacitance Ch in between, and the second trace 40 and the third trace 50 also have a horizontal coupling capacitance Ch in between. On the other hand, a vertical coupling capacitance Cv is provided between two neighboring traces configured on different layers of the first layout layer and the second layout layer. As shown in FIG. 2D, the first trace 30 and the second trace 40 have a vertical coupling capacitance Cv in between, and the fourth trace 60 and the third trace 50 also have a vertical coupling capacitance in between. As shown in FIG. 2D, the signals carried by two neighboring traces for each trace the phase difference between the two traces is 180 degrees, for example, the two neighboring traces of the first trace 30 are the second trace 40 and the fourth trace 60, and the signals carried by the second trace 40 and the fourth trace 60 respectively have the phase at 90 degrees and 270 degrees (−90 degrees); and, the two neighboring traces of the second trace 40 are the first trace 30 and the third trace 50, and the signals carried by the first trace 30 and the third trace 50 respectively have the phase at 0 degrees and 180 degrees; similarly, the two neighboring traces of the third trace 50 are the second trace 40 and the fourth trace 60, and the two neighboring traces of the fourth trace 60 are the first trace 30 and the third trace 50. From the principle exposition diagram of FIG. 2B, it can be seen that the layout structure can eliminate the effect of coupling capacitance. Such a layout structure employs a geometrically symmetrical mechanism to eliminate the effect of coupling capacitance.

Please refer to FIG. 2C again, especially for the first half and the second half of FIG. 2C. It can be found that the layout in the second half of FIG. 2C is rotated 90 degrees clockwise from the position in the first half of FIG. 2C. As shown in FIG. 2C, the first trace 30 includes a first section 31 and a second section 32, the second trace 40 includes a first section 41 and a second section 42, the third trace 50 includes a first section 51 and a second section 52, and the fourth trace 60 includes a first section 61 and a second section 62. That is, by rotating the first section of each trace 90 degrees clockwise, the position configured for the second section of each trace is achieved. Herein, without being limited to a 90 degrees clockwise rotation, the same effect is achieved as by rotating 90 degrees counterclockwise. Further, as shown in the figure, the first section of one of the first trace 30 through to the fourth trace 60 is substantially overlaid with the first section of another one of the plurality of traces. For example, the first section 31 of the first trace is overlaid with the first section 41 of the second trace; and, the first section 61 of the fourth trace is also overlaid with the first section 51 of the third trace.

It should be explained firstly that the first section and the second section of each trace are connected with each other. In FIG. 2C the first section and the second section of each trace are shown separately for convenience. Moreover, the length of the first section may be equal to the length of the second section for each trace.

Figure 2E:
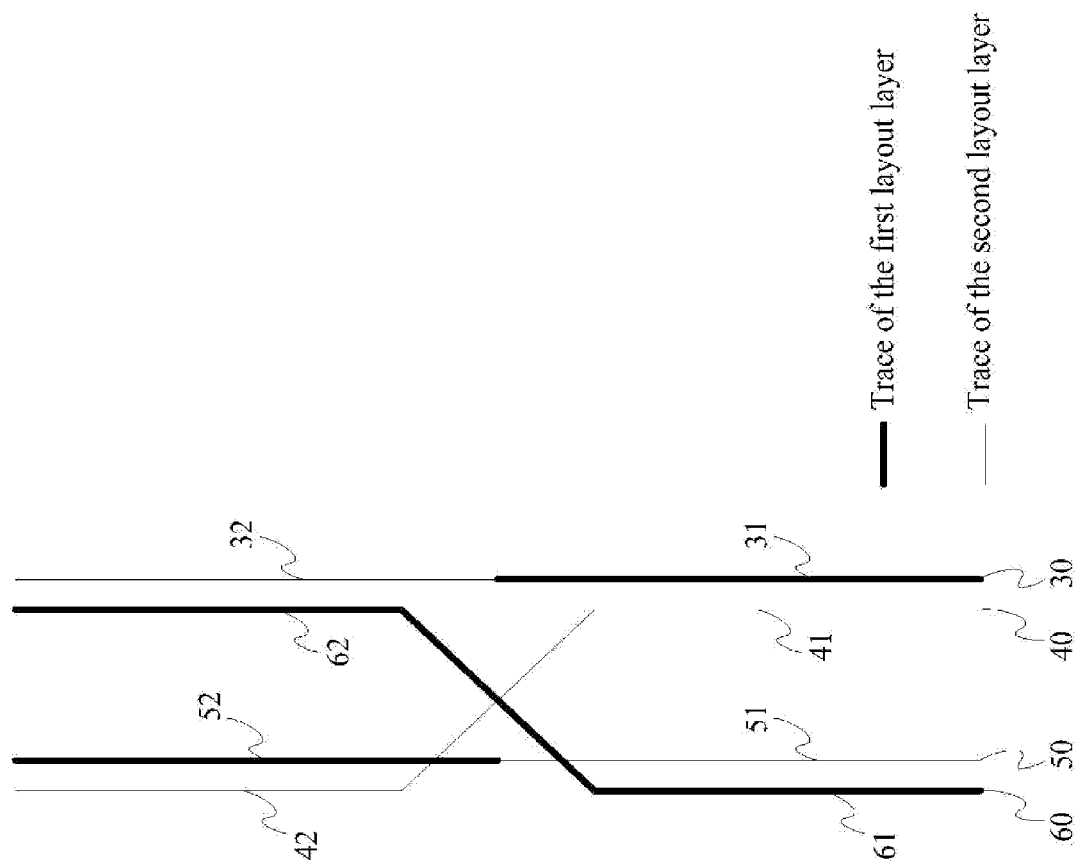
FIG. 2E is a top view of the first embodiment of the present invention.

Please refer to FIG. 2E, which is a top view of FIG. 2C. The top view of the layout arrangement of each trace on the first layout layer and the second layout layer can be seen clearly. The bolded lines in the figure indicate the traces located on the first layout layer, and the thin lines indicate the traces located on the second layout layer. As shown in the figure, it can be seen clearly that the first section and the second section of each trace are connected with each other.

Please refer regularly to FIG. 2C. The first section 61 of the fourth trace and the first section 31 of the first trace have a horizontal coupling capacitance Ch in between, and the second section 62 of the fourth trace and the second section 32 of the first trace have a vertical coupling capacitance Cv in between, so that the coupling capacitance between the first trace and the fourth trace is a parallel connection of the horizontal coupling capacitance Ch and the vertical coupling capacitance Cv. Similarly, the total coupling capacitance between a trace and its neighboring traces (i.e. a parallel connection of the horizontal coupling capacitance Ch and the vertical coupling capacitance Cv) is substantially identical for each trace, so as to achieve electrical symmetry. Thus, the electrical characteristics for the first trace 30, the second trace 40, the third trace 50 and the fourth trace 60 defined by the horizontal coupling capacitance Ch and the vertical coupling capacitance Cv are substantially identical.

It can be deduced from the above description that the total coupling capacitance between a trace and its neighboring traces is the sum of the horizontal coupling capacitance Ch and the vertical coupling capacitance Cv connected in parallel, that is, substantially equal to Ch+Cv.

Figure 3A:
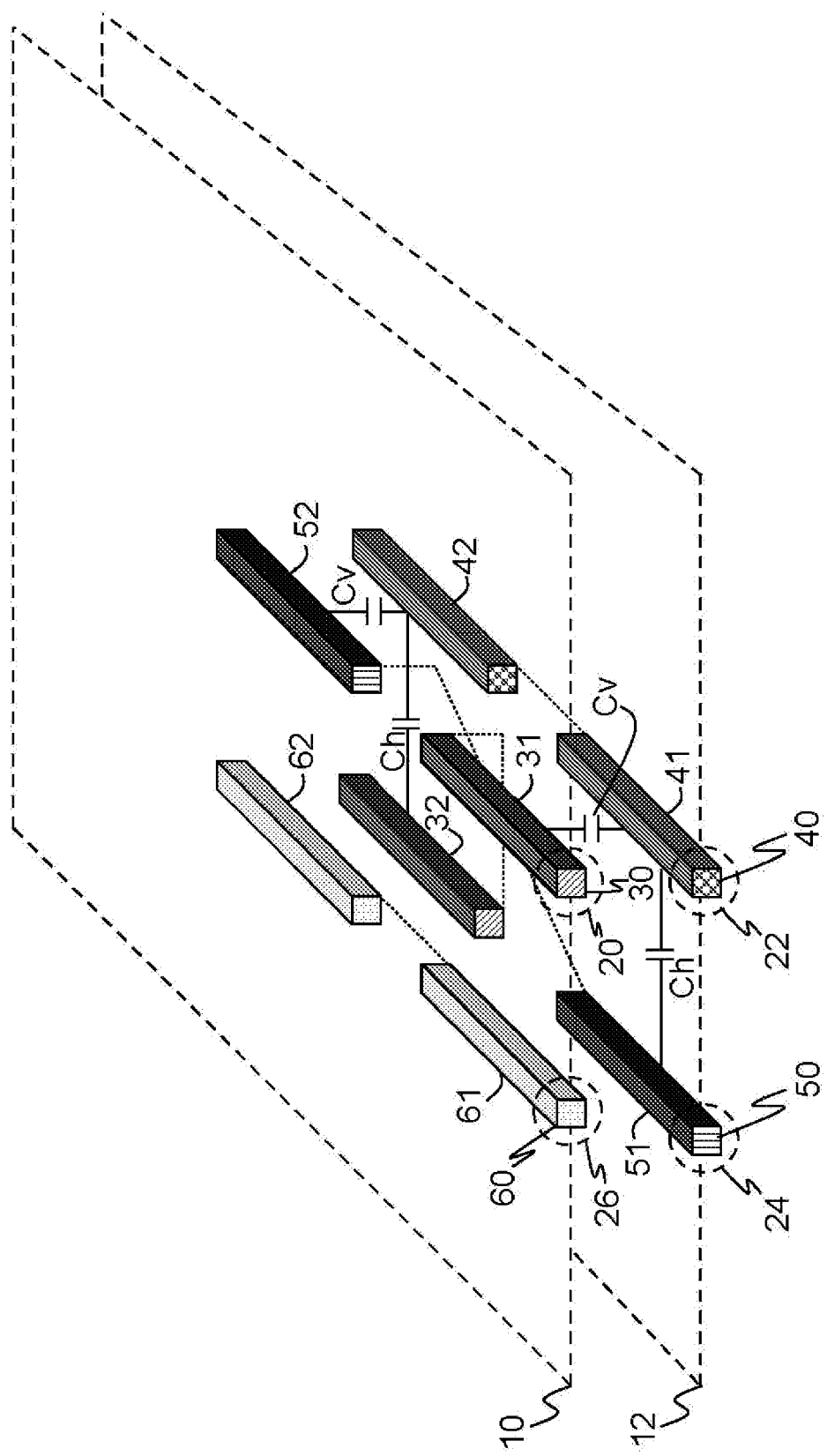
FIG. 3A is a first schematic view of a second embodiment of the present invention.

Please refer to FIG. 3A, which is a first schematic view of a second embodiment of the present invention. In the embodiment, similarly, each trace includes two sections. The difference between FIG. 3A and FIG. 2D is that in the second embodiment the first section 41 and the second section 42 of the second trace 40 are configured at the same location i.e. the second location 22. Similarly, the first section 61 and the second section 62 of the fourth trace 60 are configured at the same location, i.e. the fourth location 26. The first section and the second section of the first trace 30 and the third trace 50 are configured at different locations. As shown in the figure, the layout design similarly allows the total coupling capacitance between a trace and its neighboring traces to be the sum of the horizontal coupling capacitance Ch plus the vertical coupling capacitance Cv, therefore, the total coupling capacitances between traces are matched with each other.

Figure 3B:
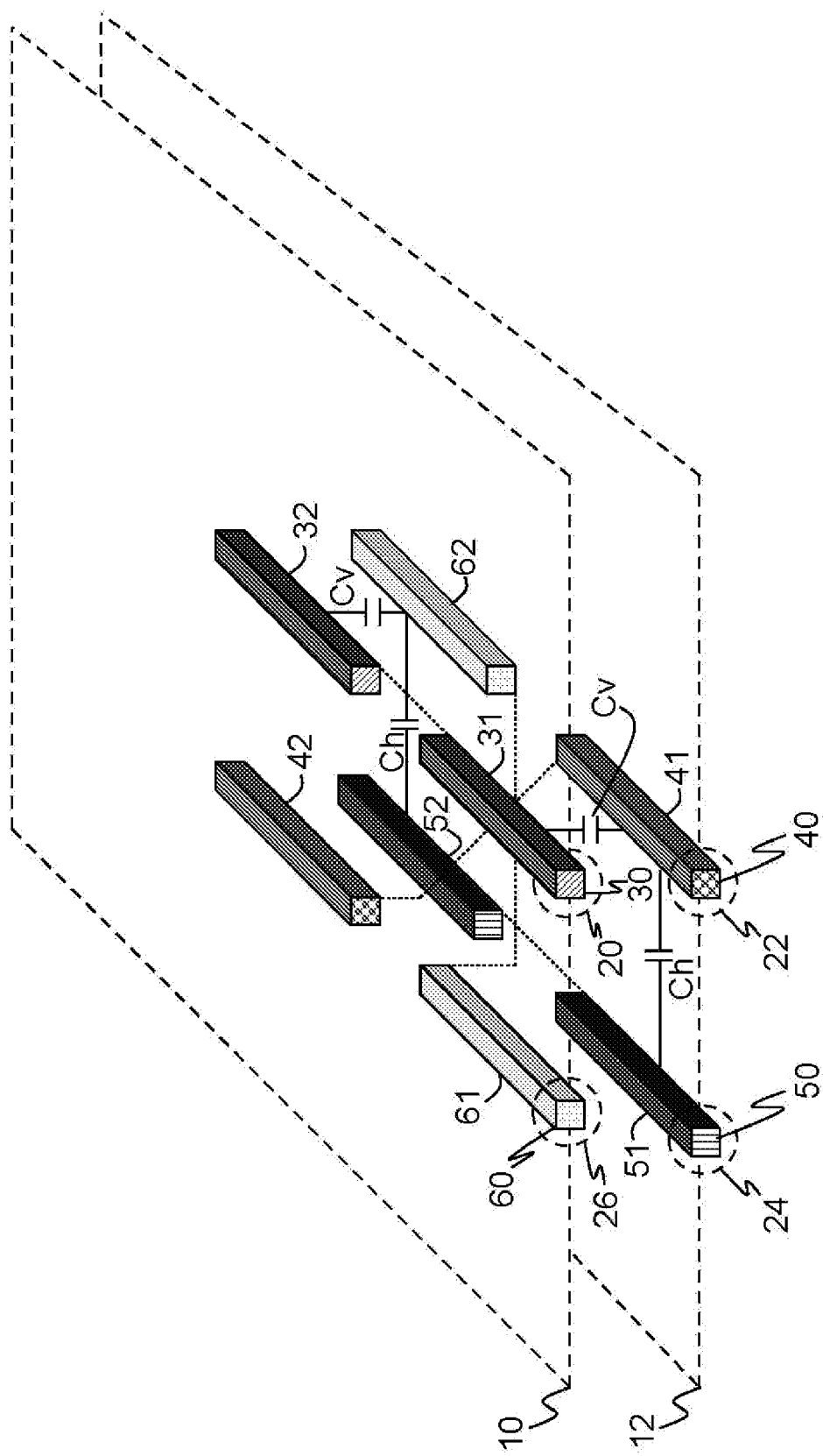
FIG. 3B is a second schematic view of the second embodiment of the present invention.

Similarly, the first section 31 and the second section 32 of the first trace 30, and the first section 51 and the second section 52 of the third trace 50 can be also configured at the same locations, i.e. the first location 20 and the third location 24, respectively. In contrast, the first sections of the second trace 40 and the fourth trace 60 are respectively configured at the second location 22 and the fourth location 26, the second sections of the second trace 40 and the fourth trace 60 interchange their positions, are respectively configured at the fourth location 26 and the second location 22, as shown in FIG. 3B.

Figure 4A:
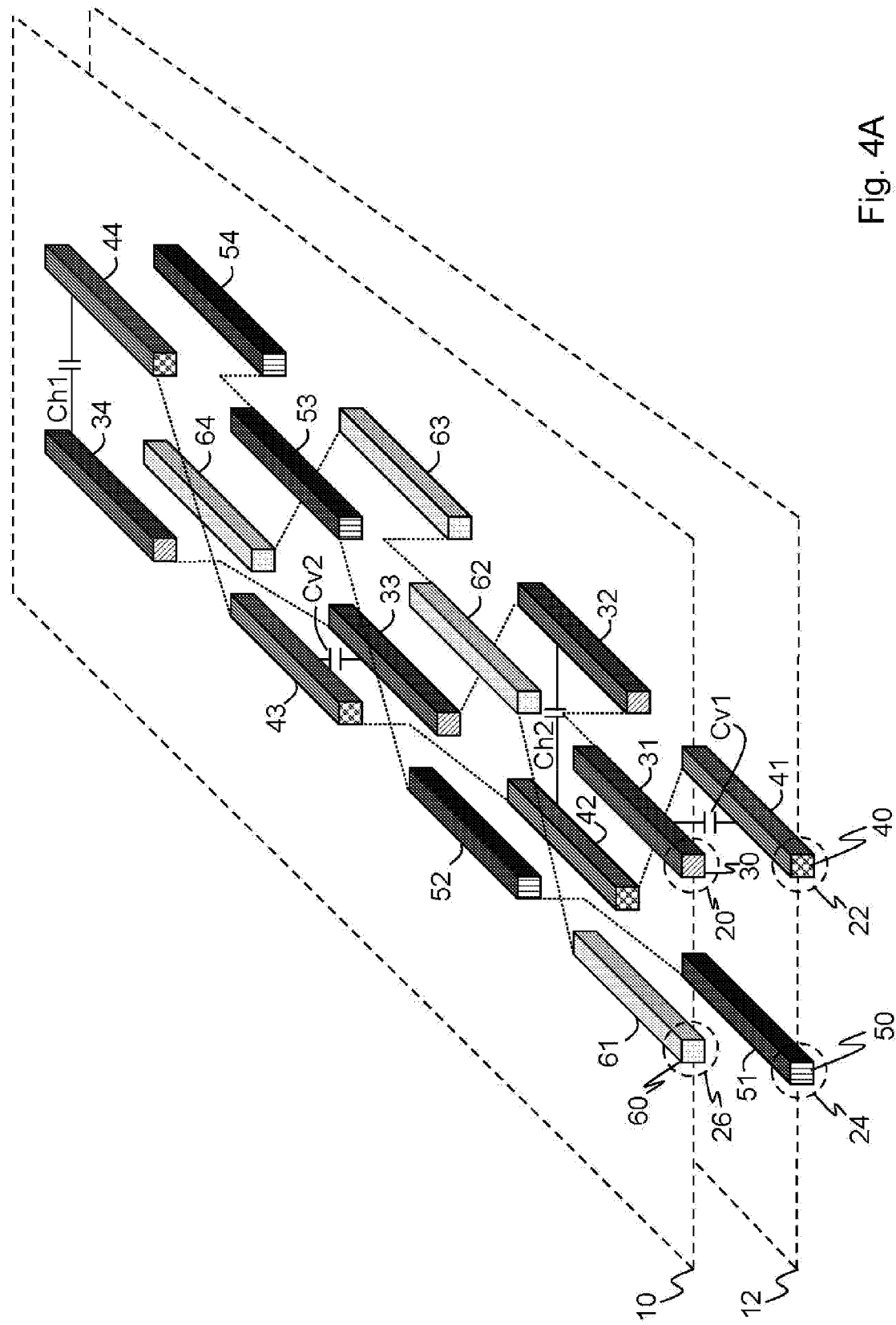
FIG. 4A is a schematic view of a third embodiment of the present invention.

FIG. 4A is a schematic view of the preferred of the present invention, i.e. the third embodiment. In the third embodiment, the first trace 30 includes a first section 31, second section 32, third section 33, and a fourth section 34; the second trace 40 includes a first section 41, second section 42, third section 43, and a fourth section 44; the third trace 50 includes a first section 51, second section 52, third section 53, and a fourth section 54; and, the fourth trace 60 includes a first section 61, second section 62, third section 63, and a fourth section 64. The first sections of first trace 30 through to fourth trace 60 are respectively configured at the first location 20 to the fourth location 26; next, rotating the second section of each trace 90 degrees; and, further rotating the third section of each trace 90 degrees in the same direction; finally, further rotating the fourth section of each trace 90 degrees in the same direction. With the above-mentioned configuration, the total coupling capacitances between traces will all be as follows: the first horizontal coupling capacitance Ch1 in parallel connection with the second horizontal coupling capacitance Ch2 in parallel connection with the first vertical coupling capacitance Cv1 in parallel connection with the second vertical coupling capacitance Cv2. Thus, the total coupling capacitances between traces are matched with each other, and all equal Ch1+Ch2+Cv1+Cv2.

Figure 4B:
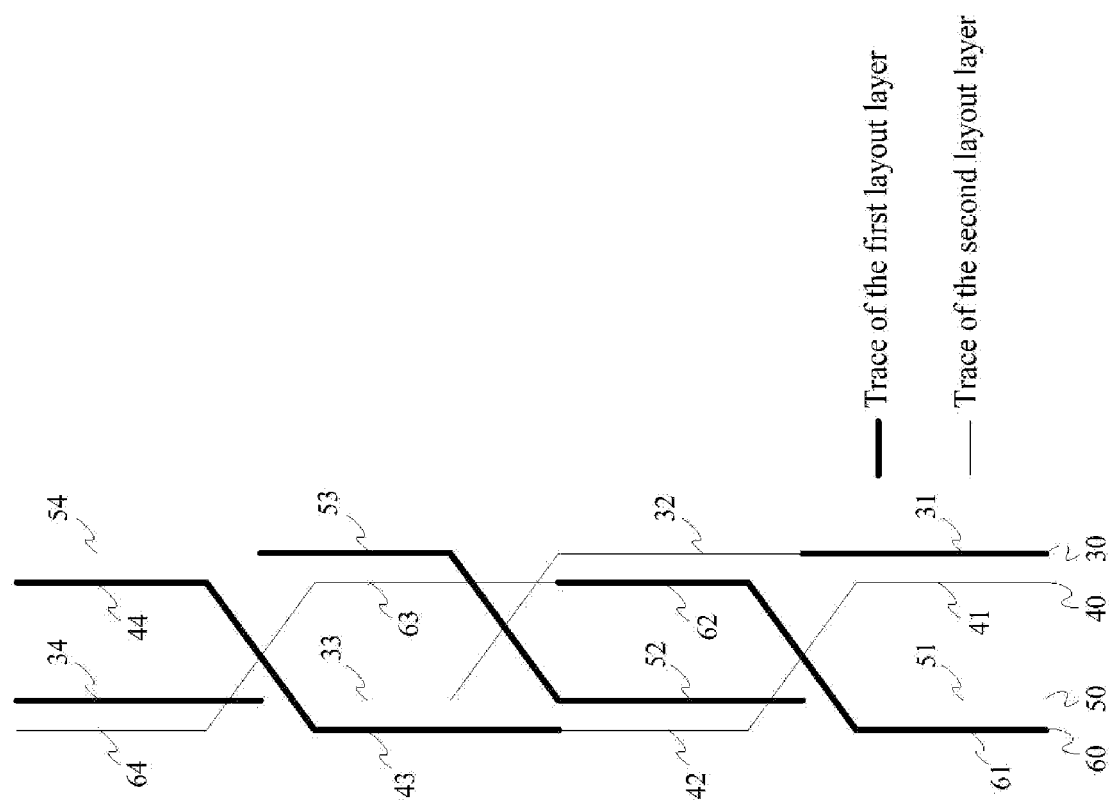
FIG. 4B is a top view of the third embodiment of the present invention.

Please refer to FIG. 4B, which is a top view corresponding to FIG. 4A. It can be clearly seen from the top view how the first section to the fourth section of each trace are configured on the first layout layer (illustrated in bold line) and the second layout layer (illustrated in a thin line), and it can also be clearly seen that the first section to the fourth section of each trace are connected with each other. Moreover, the first section to the fourth section of each trace may have an identical length.

The trace layout in the above-mentioned first to third embodiments is geometrically symmetrical. The term "geometrically symmetrical" means that the geometrical shape is completely symmetrical and consistent regardless of the angle from which trace the layout structure is viewed. With a geometrical symmetry, the total coupling capacitances between phases are matched with each other for eliminating the effect of capacitance and delay time.

Figure 5:
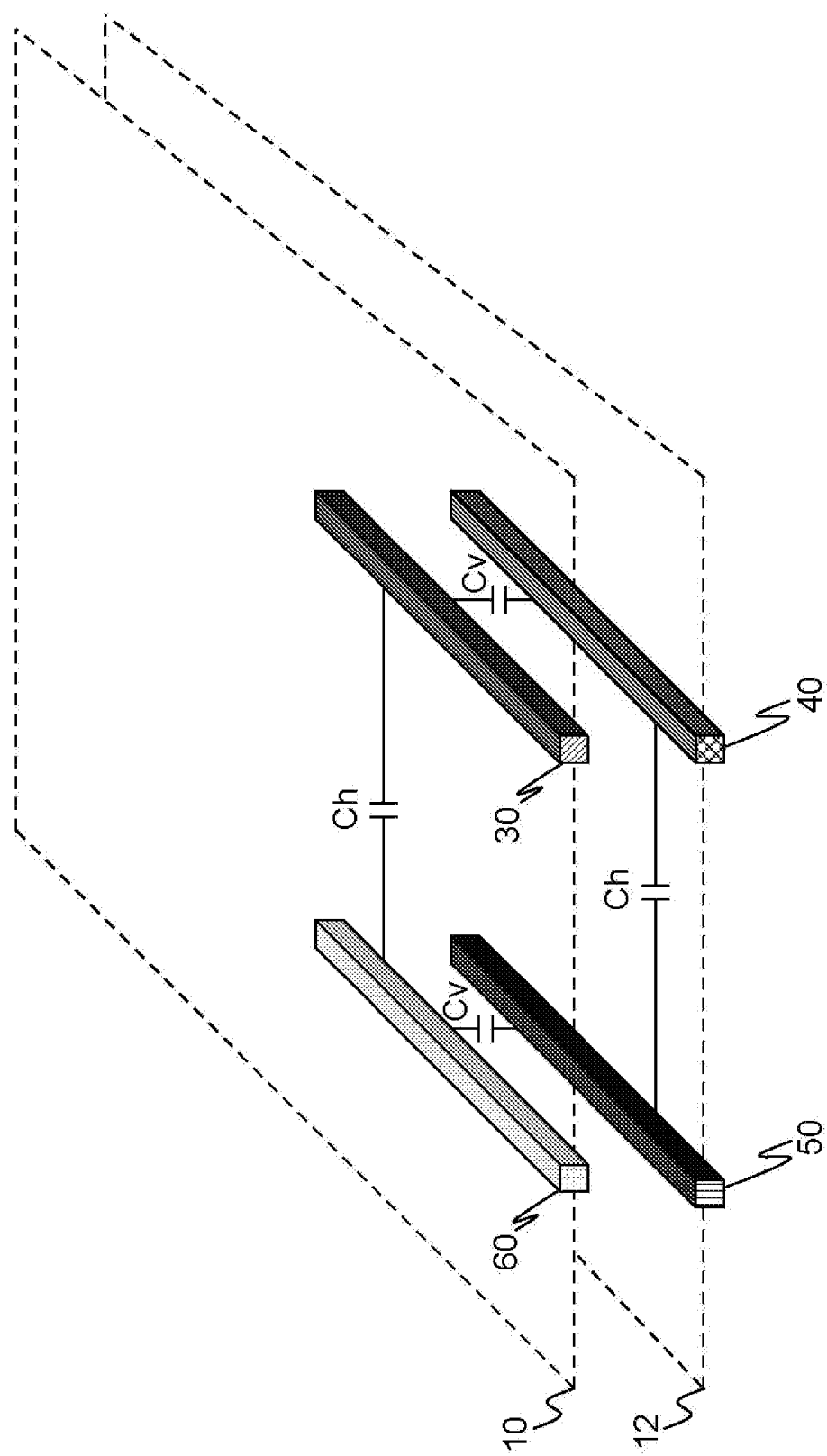
FIG. 5 is a schematic view of a fourth embodiment of the present invention.

Please refer to FIG. 5, which is a schematic view of a fourth embodiment of the present invention. The difference between the fourth embodiment and the embodiment of FIG. 4A and 4B is that the embodiment of FIG. 5 will adjust the distance between traces to ensure the total coupling capacitances between traces match each other.

The fourth embodiment also exemplifies the present invention by using four traces, but the number of the traces is not limited to four. The first trace 30 is configured on the first layout layer 10 for carrying the first signal. The second trace 40 is configured on the second layout layer 12 for carrying the second signal, and the phase difference between the second signal and the first signal is 90 degree. The third trace 50 is configured on the second layout layer 12 for carrying the third signal, and the phase difference between the third signal and the second signal is 90 degrees. The fourth trace 60 is configured on the first layout layer 10 for carried the fourth signal, and the phase difference between the fourth signal and the third signal is 90 degrees. The signals carried by each trace may be a horizontally synchronized signal.

Two neighboring traces configured in the first layout layer 10 and the second layout layer 12 (as shown in the figure, the first trace 30 and the fourth trace 60, and the second trace 40 and the third trace 50) have a horizontal coupling capacitance Ch in between the two neighboring traces. On the other hand, two neighboring traces configured on different layers of the first layout layer 10 and the second layout layer 12 (as shown in the figure, the first trace 30 and the second trace 40, and the fourth trace 60 and the third trace 50) has a vertical coupling capacitance Cv in between. Because of the existence of the coupling capacitance between traces, the capacitance value is inversely proportional to the distance between the two traces. Thus, based on this property, the total coupling capacitance (no matter the horizontal coupling capacitance Ch or the vertical coupling capacitance Cv) between traces for each trace can be matched with each other by adjusting the distance between traces, that is, the horizontal coupling capacitance Ch is substantially equal to the vertical coupling capacitance Cv. The trace layout in this embodiment is electrically symmetrical. The term "electrically symmetrical" means that the electrical characteristics are all symmetrical and consistent no matter from which trace the layout structure is viewed. The effect of capacitance and delay time is thus eliminated.

Although the technical contents of the present invention have been disclosed with reference to the embodiments as stated above, these embodiments are not intended to limit the present invention. Those proficient in the relevant fields can make changes and modifications without departing from the spirit of the present invention, and these changes and modification should be all included in the scope of the present invention. Therefore, the protection scope of the present invention will be defined by the attached claims.

What is claimed is:

1. A layout structure, which comprises:
a first layout layer;
a second layout layer, which is substantially parallel to the first layout layer; and,
a plurality of traces, each trace carrying a signal, and the plurality of signals having a phase difference between each other;
wherein two neighboring traces configured on the same layer of the first layout layer and the second layout layer have a respective horizontal coupling capacitance in between, two neighboring traces configured on different layers of the first layout layer and the second layout layer have a respective vertical coupling capacitance in between, and each of the plurality of traces have a substantially equal total coupling capacitance wherein the total coupling capacitance is defined by the respective horizontal coupling capacitance and the respective vertical coupling capacitance;
wherein each of the traces comprises a first section, a second section, a third section and a fourth section.

2. The layout structure of claim 1, wherein the first section, the second section, the third section and the fourth section of each of the traces are positioned clockwise or counterclockwise, with respect to each other.

3. The layout structure of claim 1, wherein the first section, the second section, the third section and the fourth section of each of the traces are of substantially identical length.

4. A layout structure, which comprises:
a first layout layer;
a second layout layer, which is substantially parallel to the first layout layer; and,
a plurality of traces, each trace carrying a signal, and the plurality of signals having a phase difference between each other;
wherein two neighboring traces configured on the same layer of the first layout layer and the second layout layer have a respective horizontal coupling capacitance in between, two neighboring traces configured on different layers of the first layout layer and the second layout layer have a respective vertical coupling capacitance in between, and each of the plurality of traces have a substantially equal total coupling capacitance wherein the total coupling capacitance is defined by the respective horizontal coupling capacitance and the respective vertical coupling capacitance, and wherein the total coupling capacitance is a parallel connection of at least one horizontal coupling capacitance and at least one vertical coupling capacitance.

5. The layout structure of claim 1, wherein each of the traces comprises a first section and a second section; and the second section in each of the traces is at a position corresponding to the position of the first section of the same trace with a clockwise or counterclockwise rotation of 90 degrees.

6. The layout structure of claim 5, wherein the first section and the second section of each of the traces are of substantially identical length.

7. The layout structure of claim 1, wherein each of the traces comprises a first section, a second section, a third section and a fourth section.

8. The layout structure of claim 7, wherein the first section, the second section, the third section and the fourth section of each of the traces are of substantially identical length.

9. The layout structure of claim 7, wherein the first section, the second section, the third section and the fourth section of each of the traces are positioned clockwise or counterclockwise, with respect to each other.

10. The layout structure of claim 1, wherein phase differences between the plurality of signals are substantially 0 degrees, 90 degrees, 180 degrees and 270 degrees respectively.

11. The layout structure of claim 1, wherein the phase difference between the signals carried on any two neighboring traces for each trace is substantially 180 degrees.

12. A layout method, which comprises the following steps:
providing a first layout layer and a second layout layer, and the first layout layer and the second layout layer are substantially parallel to each other; and,
forming a plurality of signal traces, wherein two neighboring traces configured on the same layer of the first layout layer and the second layout layer have a respective horizontal coupling capacitance in between, two neighboring traces configured on different layers of the first layout layer and the second layout layer have a respective vertical coupling capacitance in between, and each of the plurality of signal traces have a substantially equal total coupling capacitance wherein the total coupling capacitance is defined by the respective horizontal coupling capacitance and the respective vertical coupling capacitance, and wherein the total coupling capacitance is a parallel connection of at least one horizontal coupling capacitance and at least one vertical coupling capacitance.

13. The layout method of claim 12, wherein a phase difference between the signals carried on any two neighboring traces for each trace is substantially 180 degrees.

14. The layout method of claim 12, wherein each of the traces comprises a first section and a second section; and the second section in each of the traces is at a position corresponding to the position of the first section of the same trace with a clockwise or counterclockwise rotation of 90 degrees.

15. The layout method of claim 14, wherein the first section of one of the plurality of signal traces is substantially overlaid with the first section of another of the plurality of signal traces.

16. The layout method of claim 14, wherein the first section and the second section of each of the traces are of substantially identical length.

17. The layout method of claim 12, wherein each of the traces comprises a first section, a second section, a third section and a fourth section.

18. The layout method of claim 17, wherein the first section, the second section, the third section and the fourth section of each of the traces are of substantially identical length.

19. The layout method of claim 17, wherein the first section, the second section, the third section and the fourth section of each of the traces are positioned clockwise or counterclockwise, with respect to each other.

20. The layout method of claim 12, wherein phase differences among the plurality of signals are substantially 0 degrees, 90 degrees, 180 degrees and 270 degrees respectively.

* * * * *